US012594907B2

(12) United States Patent
Malleo et al.

(10) Patent No.: US 12,594,907 B2
(45) Date of Patent: Apr. 7, 2026

(54) VEHICLE COMPONENT THEFT DETERRENCE SYSTEMS AND METHODS

(71) Applicant: Anthony Malleo, Glendale, AZ (US)

(72) Inventors: Anthony Malleo, Glendale, AZ (US); Robert Fuge, Phoenix, AZ (US)

(73) Assignee: Malleo Anthony, Glendale, AZ (US)

( * ) Notice: Subject to any disclaimer, the term of this patent is extended or adjusted under 35 U.S.C. 154(b) by 197 days.

(21) Appl. No.: 18/520,018

(22) Filed: Nov. 27, 2023

(65) Prior Publication Data

US 2024/0181989 A1 Jun. 6, 2024

Related U.S. Application Data

(60) Provisional application No. 63/428,360, filed on Nov. 28, 2022.

(51) Int. Cl.
| | |
|---|---|
| *B60R 25/40* | (2013.01) |
| *G05F 1/46* | (2006.01) |
| *H03K 5/24* | (2006.01) |

(52) U.S. Cl.
CPC .............. *B60R 25/403* (2013.01); *G05F 1/46* (2013.01); *H03K 5/24* (2013.01)

(58) Field of Classification Search
CPC ..................................... G05F 1/46; H03K 5/24
See application file for complete search history.

(56) References Cited

U.S. PATENT DOCUMENTS

| | | | | |
|---|---|---|---|---|
| 4,794,368 | A | * 12/1988 | Grossheim | ............ B60R 25/104 |
| | | | | 340/426.25 |
| 5,146,215 | A | * 9/1992 | Drori | ....................... G07C 9/28 |
| | | | | 340/426.14 |
| 5,742,230 | A | * 4/1998 | Kuhner | .............. G01R 19/1659 |
| | | | | 340/815.45 |
| 2011/0036130 | A1* | 2/2011 | Hisler | ....................... F01N 3/28 |
| | | | | 70/57.1 |

* cited by examiner

*Primary Examiner* — Daryl C Pope
(74) *Attorney, Agent, or Firm* — SNELL & WILMER L.L.P.

(57) ABSTRACT

Systems and methods for theft deterrence monitoring of a vehicle component (e.g., a catalytic converter) can include an electrical conductor configured to be electrically connected to the vehicle component to close a circuit (i.e., the vehicle component may provide a conductive path for closing the circuit). The theft deterrence system can generate a reference voltage using the vehicle component. Tampering with or removing the vehicle component from the vehicle can alter or open the circuit, thereby altering the reference voltage. The system can compare the reference voltage with a voltage threshold and trigger an alarm in response to the reference voltage being outside the voltage threshold. The system can include a voltage divider whereby a resistor of the voltage divider is coupled in series with the vehicle component.

16 Claims, 4 Drawing Sheets

NON-INVERTING COMPARATOR

INVERTING COMPARATOR

<u>500</u>

VEHICLE COMPONENT THEFT DETERRENCE SYSTEMS AND METHODS

CROSS-REFERENCE TO RELATED APPLICATIONS

This application is a nonprovisional of, and claims priority to and the benefit of, U.S. Provisional Patent Application No. 63/428,360, filed Nov. 28, 2022 and entitled "VEHICLE COMPONENT THEFT DETERRENCE SYSTEMS AND METHODS," which is hereby incorporated by reference herein.

FIELD

The present disclosure relates generally to components found on a vehicle, and, more specifically, to systems and methods to deter theft of vehicle components.

BACKGROUND

The catalytic converter is part of a vehicle's exhaust system and is configured to reduce harmful emissions through filtering at least a portion of the harmful gaseous output from a vehicle's engine. Such filtering by a catalytic converter is accomplished by causing harmful gaseous output to contact one or more metals (e.g., precious metals) that filter out at least some of the harmful qualities of the emissions, leaving the remaining emissions that exit the exhaust system less harmful and less polluting. A rise in the global price of metals, including precious metals, contained inside catalytic converters incentivizes thieves to remove catalytic converters from vehicles using common tools and to sell them for profit to metal recyclers.

SUMMARY

In accordance with various examples, a theft deterrence system comprises a control unit comprising a first voltage divider, and an electrical conductor whereby the first voltage divider is configured to be electrically coupled to a vehicle component. The first voltage divider is configured to generate a reference voltage. The control unit is configured to compare the reference voltage with a voltage threshold. The control unit is configured to send an alarm signal to an alarm in response to the reference voltage being outside the voltage threshold.

In various examples, the first voltage divider comprises a first resistor, a second resistor, and a third resistor.

In various examples, the third resistor is configured to be coupled in series with the vehicle component via the electrical conductor.

In various examples, the control unit is configured to receive electric power from a vehicle battery.

In various examples, the vehicle component is a catalytic converter.

In various examples, the control unit further comprises a first comparator and a second comparator. The first comparator is a non-inverting comparator. The second comparator is an inverting comparator. The control unit is configured to compare the reference voltage with the voltage threshold using the first comparator and the second comparator.

In various examples, the control unit further comprises a second voltage divider and a third voltage divider. The first comparator is configured to receive a first threshold voltage from the second voltage divider. The second comparator is configured to receive a second threshold voltage from the third voltage divider. The voltage threshold is between the first threshold voltage and the second threshold voltage.

In various examples, the theft deterrence system further comprises a latching relay configured to activate the alarm.

In various examples, the latching relay is configured to receive a first output voltage from a first comparator and a second output voltage from a second comparator.

In various examples, the reference voltage is equal to a voltage measured between the second resistor and the first resistor, and the first resistor is coupled in parallel with the third resistor.

In various examples, the first voltage divider is configured to divide an input voltage received from the vehicle battery.

In various examples, the alarm comprises at least one of a speaker or a light.

In various examples, the alarm comprises a remote electronic component.

In accordance with various examples, a method for theft deterrence monitoring of a vehicle component comprises generating a reference voltage using the vehicle component to complete a circuit, comparing the reference voltage with a voltage threshold, and sending an alarm signal to an alarm in response to the reference voltage being outside the voltage threshold.

In various examples, the reference voltage is generated by a control unit receiving power from a vehicle battery, and the control unit is electrically coupled to the vehicle component via an electrical conductor.

In various examples, the reference voltage is generated using a voltage divider.

In various examples, the voltage divider comprises a first resistor, a second resistor, and a third resistor, wherein the third resistor is coupled in series with the vehicle component.

In various examples, the vehicle component is a catalytic converter.

In various examples, the alarm comprises at least one of a speaker, a light, or a remote electronic component.

In accordance with various examples, a method for theft deterrence monitoring of a vehicle component comprises receiving, by a control unit, an input voltage from a power source comprised in a vehicle, generating, by the control unit, a reference voltage using the vehicle component to complete a circuit, comparing, by the control unit, the reference voltage with a voltage threshold, detecting, by the control unit, that the reference voltage is outside of the voltage threshold, and sending, by the control unit, an alarm signal to an alarm in response to the control unit detecting that the reference voltage is outside of the voltage threshold.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be example in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

Figures 1, 2:
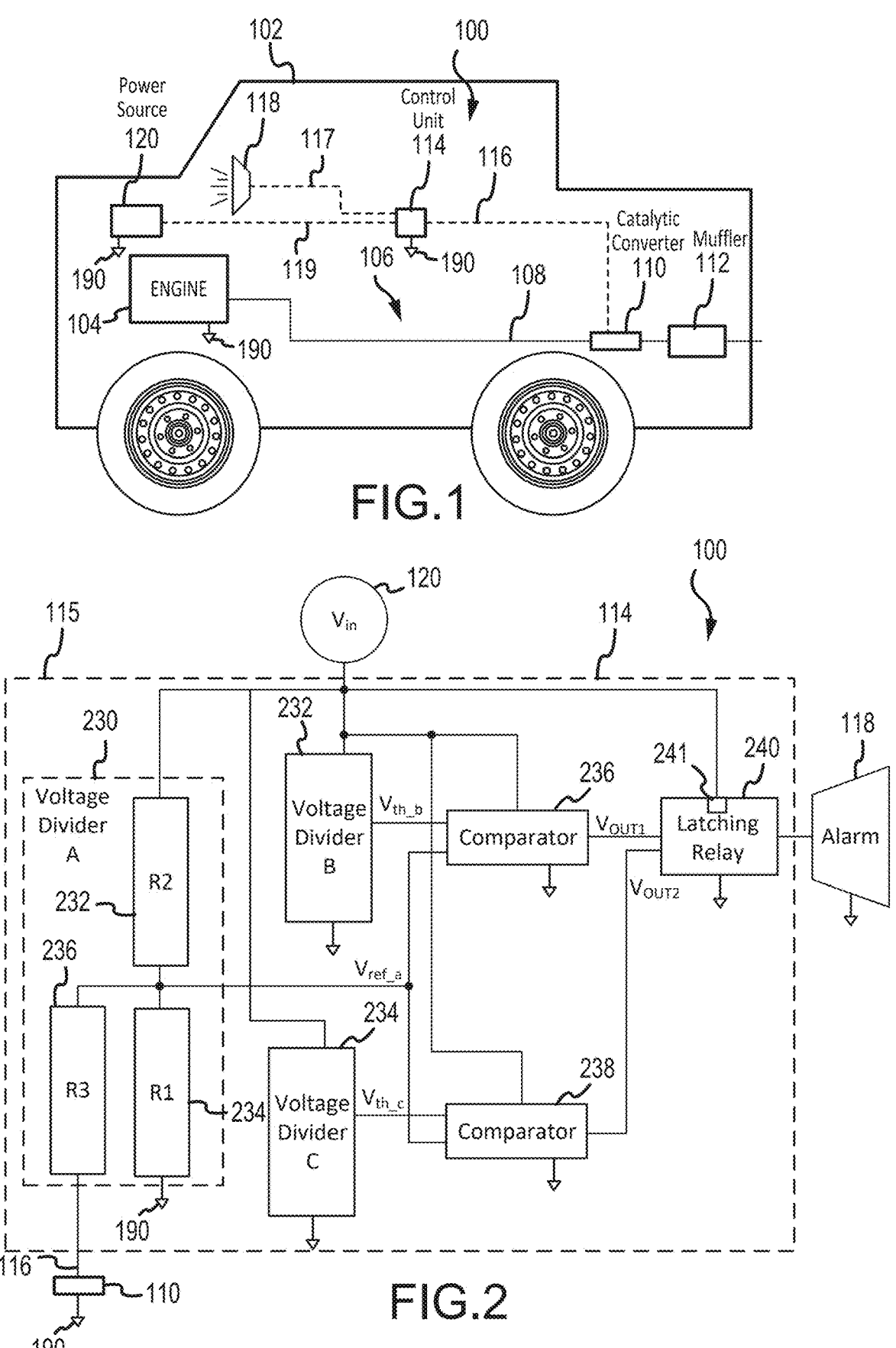
FIG. 1 illustrates a schematic view of a theft deterrence system for a vehicle component installed on a vehicle, in accordance with various examples.
FIG. 2 illustrates a block diagram of the theft deterrence system, in accordance with various examples.

All ranges and ratio limits disclosed herein may be combined. It is to be understood that unless specifically stated otherwise, references to "a," "an," and/or "the" may include one or more than one and that reference to an item in the singular may also include the item in the plural.

The detailed description of various examples herein makes reference to the accompanying drawings, which show various examples by way of illustration. While these various examples are described in sufficient detail to enable those skilled in the art to practice the disclosure, it should be understood that other examples may be realized and that logical, chemical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural examples, and any reference to more than one component or step may include a singular example or step. Also, any reference to attached, fixed, connected, or the like may include permanent, removable, temporary, partial, full, and/or any other possible attachment option. Additionally, any reference to without contact (or similar phrases) may also include reduced contact or minimal contact. Cross hatching lines may be used throughout the figures to denote different parts but not necessarily to denote the same or different materials.

The present disclosure provides a theft deterrence system for a vehicle component, such as a catalytic converter, or any suitable component where theft deterrence is desired. A theft deterrence system of the present disclosure may be readily retrofittable into an existing vehicle. Systems and methods of the present disclosure contemplate theft deterrence of a vehicle component comprising a catalytic converter, though the theft deterrence system of the present disclosure can be utilized for a variety of vehicle components. For example, the theft deterrence systems and methods can be utilized where the component is capable of completing a circuit (e.g., where the component is electrically coupled to a common ground). A theft deterrence system of the present disclosure may be suitable for low-cost manufacturing. A theft deterrence system of the present disclosure may be robust, effective, and easy-to-use to deter thieves from removing a vehicle's catalytic converter or other vehicle components.

In various examples, a theft deterrence system of the present disclosure can utilize a voltage divider for generating a reference voltage monitored by the system. The voltage divider can comprise two resistors in parallel, across which the reference voltage is measured or generated and/or monitored. The vehicle component is coupled in series with one of these two resistors such that tampering with the vehicle component causes the resistance in the respective branch of the voltage divider to vary (e.g., relative to the other branch comprising the other resistor), thereby varying the monitored reference voltage. In response to the system detecting the reference voltage of the circuit branch comprising the vehicle component being outside of a voltage envelope or threshold, the system triggers an alarm to deter the would-be thief from further tampering with the vehicle component and/or to alarm others.

FIG. 1 illustrates a schematic diagram of a theft deterrence system 100 for a vehicle 102, in accordance with various examples. Vehicle 102 can be any suitable vehicle having components thereon for which theft deterrence is desired. Vehicle 102 can be an automobile. In the illustrated exemplary embodiment, theft deterrence system 100 is monitoring a catalytic converter 110; however it should be understood that theft deterrence system 100 can be configured to monitor various vehicle components grounded in a complete circuit (e.g., wheels, tailgates, hoods, etc.), for which theft deterrence is desired. Vehicle 102 can be an internal combustion engine vehicle (ICEV) including an internal combustion engine 104 and an exhaust system 106 for the internal combustion engine 104. Exhaust system 106 includes an exhaust pipe 108 configured to route exhaust gases through one or more components (e.g., catalytic converter 110 and/or a muffler 112) of the exhaust system 106 and ultimately away from vehicle 102.

In various examples, theft deterrence system 100 comprises a control unit 114 configured to monitor the vehicle component (e.g., catalytic converter 110) with an electrical conductor 116. As described in greater detail herein, control unit 114 can be electrically coupled to catalytic converter 110 with electrical conductor 116 such that the catalytic converter 110 itself completes a circuit monitored by control unit 114. Control unit 114 can detect an open circuit, a short circuit, or change in resistance of the circuit—for example in response to a thief cutting the catalytic converter 110 off of vehicle 102—and can trigger a deterrence alarm 118 in response thereto.

Electrical conductor 116 can comprise any suitable conductor for routing electric power such as a wire, a cable, or the like. Electrical conductor 116 can be insulated. Stated differently, electrical conductor 116 can comprise a central conductor(s) or wire(s) enclosed in insulating material. Electrical conductor 116 can be made from a metal or metal alloy having a low temperature coefficient of resistance such that the electrical resistance of electrical conductor 116 does not change (or changes very little) as the temperature changes, for example as the catalytic converter 110 is heated during operation of vehicle 102, to avoid false theft detection. Electrical conductor 116 can comprise metallic materials or compounds comprising elemental and/or ionic copper, silver, gold, aluminum, stainless steel, tin, nickel, or combinations of these materials, among other conductive materials, in accordance with various examples.

Theft deterrence system 100 can further comprise alarm 118 electrically coupled to control unit 114. In various examples, alarm 118 comprises a speaker. Control unit 114 can send an alarm signal to the alarm 118 to generate an audible signal to deter the would-be thief and/or alert those nearby that the control unit 114 has detected that the vehicle component (e.g., catalytic converter 110) is being tampered with and/or stolen. In various examples, alarm 118 comprises a light. Control unit 114 can send the alarm signal to alarm 118 for generating a visual signal to deter the would-be thief and/or alert those nearby. In various examples, alarm 118 is a dedicated speaker and/or light for control unit 114. In various examples, alarm 118 is an existing speaker and/or light located onboard vehicle 102. For example, alarm 118 can comprise a horn, a headlight, a running light, a brake light, or combinations of these (e.g., an existing vehicle horn and/or lights of vehicle 102 can be integrated into the theft deterrence system 100). In this regard, theft deterrence system 100 can integrate with existing components of vehicle 102. In various examples, theft deterrence system 100 comprises wires 117 for connecting control unit 114 to alarm 118.

In various examples, alarm 118 comprises a remote electronic component (e.g., personal device, a smartphone, a tablet, a computer, a computer network, etc.). Control unit 114 can send the alarm signal to alarm 118 whereby a remote user or network can be notified that the vehicle component is being tampered with and/or stolen (e.g., by receiving a notification through an application on a personal device, such as a smartphone). For example, with momentary reference to FIG. 7, control unit 114 can include one or more of a computing unit 132 and a communication unit 134. The computing unit 132 and the communication unit 134 can be in operative or electronic communication with each other. As discussed further herein, the computing unit 132 can include logic configured to control the communication unit 134.

In various examples, the computing unit 132 can comprise any suitable computing device capable of controlling the communication unit 134. For example, the computing unit 132 can include a processor and a tangible, non-transitory memory. The computing unit 132 can comprise one or more logic modules that implement logic to control the communication unit 134. The computing unit 132 can include a general purpose processor, a digital signal processor (DSP), an application specific integrated circuit (ASIC), a field programmable gate array (FPGA) or other programmable logic device, discrete gate or transistor logic, a graphics processing unit (GPU), discrete hardware components, or any combination thereof. In various examples, use of the computing unit 132 and the communication unit 134 can allow the control unit 114 to communicate with a remote electronic component 136. Stated differently, control unit 114 can be configured to present a notification on a personal device, such as remote electronic component 136, in response to the alarm signal being sent and/or in response to the alarm 118 being activated.

In various examples, the communication unit 134 can comprise any suitable communications interface. The communication unit 134 enables data to be transferred to remote electronic component 136. The communication unit 134, for example, can include a modem, a network interface (e.g., an Ethernet card), a communications port, a Personal Computer Memory Card International Association (PCMCIA) slot and card or the like. Data transferred via the communication unit

134 can be in the form of electronic, electromagnetic or optical signals, or other signals capable of being transmitted and/or received by the communication unit 134. These signals are provided to the remote electronic component 136 via a communications path or a network 140. The network 140 can be configured to transmit the signals and can be implemented using a wire, a cable, a fiber optic line, a telephone line, a cellular link, a radio frequency (RF) link, a wireless link or other communication channel. In such manner, the network 140 can connect control unit 114 with remote electronic component 136, via the communication unit 134.

In response to the alarm signal being sent and/or in response to the alarm 118 being activated, computing unit 132 can command communication unit 134 to send an alert to remote electronic component 136 via network 140. Remote electronic component 136 can receive a notification through an application installed thereon, alerting the user of the tampering. In various examples, the notification can be a pop-up notification presented on a display screen of the remote electronic component 136. In various examples, a text message is sent to the remote electronic component 136 as the notification. The notification can comprise data (e.g., a timestamp, location, and/or the like) corresponding to the tampering event. In this manner, a remote user can be alerted in response to catalytic converter 110 being tampered with.

In various examples, and with reference again to FIG. 1, control unit 114 receives electric power from a power source 120, such as a battery located onboard vehicle 102. Power source 120 can be an existing battery located onboard vehicle 102, for example an existing 12-volt vehicle battery; though in various examples, power source 120 can be a battery dedicated to control unit 114. In various examples, theft deterrence system 100 comprises wires 119 for connecting control unit 114 to power source 120.

In various examples, power source 120, control unit 114, and/or catalytic converter 110 can be electrically coupled to a common ground 190. Control unit 114 can be directly grounded to common ground 190 or can be grounded to common ground 190 via power source 120. Catalytic converter 110 can be grounded to common ground 190 directly or can be grounded to common ground 190 via internal combustion engine 104 (and/or exhaust pipe 108). In this manner, catalytic converter 110, together with control unit 114, can complete a circuit monitored by control unit 114, as described herein.

To install theft deterrence system 100, electrical conductor 116 can be electrically coupled to catalytic converter 110, for example via a bolt, a screw, a weld, tension or tight fit, or any other suitable electric connection. In this manner, catalytic converter 110 can provide a ground connection—the catalytic converter 110 itself being directly or indirectly connected to a common ground 190 of the circuit—for the circuit. Control unit 114 can be mounted to the vehicle 102. In various examples, control unit 114 is located away from the catalytic converter 110 (e.g., in the cab of the vehicle 102 or under the hood of the vehicle), and the electrical conductor 116 is routed to the catalytic converter 110. Control unit 114 can be connected to alarm 118 with wires 117. Control unit 114 can be connected to power source 120 with wires 119.

FIG. 2 illustrates a block diagram of theft deterrence system 100, in accordance with various examples. Control unit 114 can include a first voltage divider 230 (also referred to herein as "voltage divider A"). First voltage divider 230 can be configured to step down the input voltage V_{in} (e.g., 12 volts) from power source 120 to a reference voltage $V_{ref\_a}$. Control unit 114 can further include a second voltage divider 232 (also referred to herein as "voltage divider B"). Second voltage divider 232 can be configured to step down the input voltage Vi, from power source 120 to a first threshold voltage $V_{th\_b}$. Control unit 114 can further include a third voltage divider 234 (also referred to herein as "voltage divider C"). Third voltage divider 234 can be configured to step down the input voltage $V_{in}$ from power source 120 to a second threshold voltage $V_{th\_c}$. While, in various examples, voltage divider 232 and voltage divider 234 are implemented using analog components (e.g., resistors), voltage divider 232 and voltage divider 234 can also be implemented digitally, where the reference voltage $V_{ref\_a}$ can be converted to a digital signal and compared with voltage threshold values stored in memory of the control unit 114.

Figure 3A:
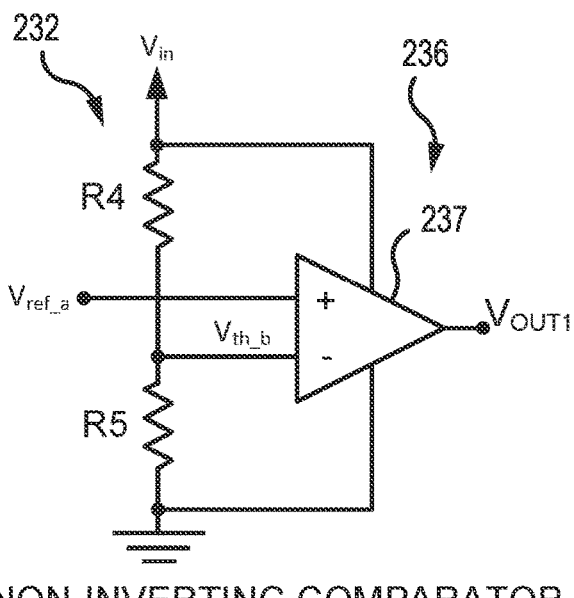
FIG. 3A illustrates an exemplary circuit diagram of a non-inverting comparator connected to a second voltage divider, in accordance with various examples.
Figure 3B:
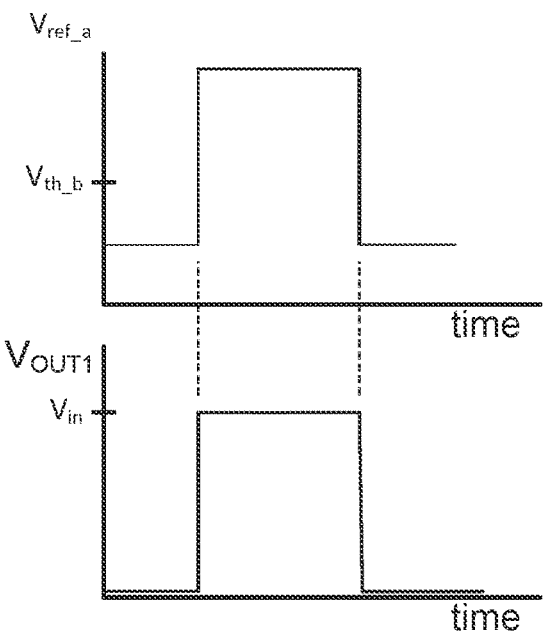
FIG. 3B illustrates a reference signal and a corresponding voltage output of the non-inverting comparator, in accordance with various examples.

Control unit 114 can further include a first comparator 236. In various examples, first comparator 236 can be a non-inverting comparator. For example, in various examples, and with momentary reference to FIG. 3A and FIG. 3B, first comparator 236 can comprise an op-amp (operational amplifier) 237 configured to receive the reference voltage $V_{ref\_a}$ and the first threshold voltage $V_{th\_b}$. First threshold voltage $V_{th\_b}$ can be received at an inverting pin (−) of the op-amp 237 and reference voltage $V_{ref\_a}$ can be received at a non-inverting pin (+) of the op-amp 237. In response to the reference voltage $V_{ref\_a}$ being less than the first threshold voltage $V_{th\_b}$, the op-amp 237 can be configured to output the low saturation value or ground (e.g., zero volts). In response to the reference voltage $V_{ref\_a}$ being greater than the first threshold voltage $V_{th\_b}$, the op-amp 237 can be configured to output the high saturation value or the input voltage Vi, (e.g., 12 volts).

Figure 4A:
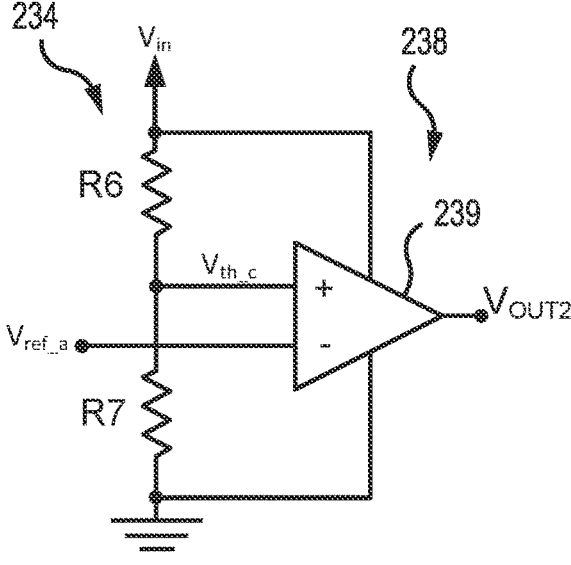
FIG. 4A illustrates an exemplary circuit diagram of an inverting comparator connected to a third voltage divider, in accordance with various examples.
Figure 4B:
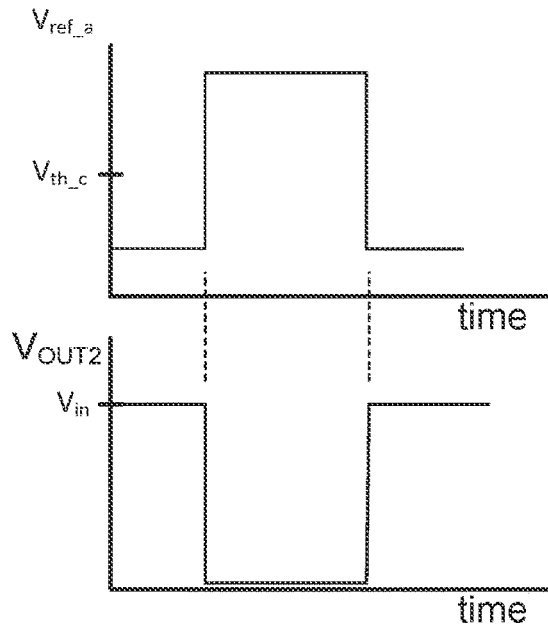
FIG. 4B illustrates a reference signal and a corresponding voltage output of the inverting comparator, in accordance with various examples.

Control unit 114 can further include a second comparator 238. In various examples, second comparator 238 can be an inverting comparator. For example, in various examples, and with momentary reference to FIG. 4A and FIG. 4B, second comparator 238 can comprise an op-amp (operational amplifier) 239 configured to receive the reference voltage $V_{ref\_a}$ and the second threshold voltage $V_{th\_c}$. Second threshold voltage $V_{th\_c}$ can be received at a non-inverting pin (+) of the op-amp 237 and reference voltage $V_{ref\_a}$ can be received at an inverting pin (−) of the op-amp 237. In response to the reference voltage $V_{ref\_a}$ being less than the second threshold voltage $V_{th\_c}$, the op-amp 237 can be configured to output the high saturation value or the input voltage $V_{in}$ (e.g., 12 volts). In response to the reference voltage $V_{ref\_a}$ being greater than the second threshold voltage $V_{th\_c}$, the op-amp 237 can be configured to output the low saturation value or ground (e.g., zero volts).

While, in various examples, first comparator 236 and second comparator 238 are implemented using analog components (e.g., op-amps), first comparator 236 and second comparator 238 can also be implemented digitally, where the reference voltage $V_{ref\_a}$ can be converted to a digital signal and compared with voltage threshold values stored in memory of the control unit 114.

With reference again to FIG. 2, control unit 114 can further include a latching relay 240. Latching relay 240 can be configured to receive the output voltage $V_{OUT1}$ from first comparator 236. Latching relay 240 can be configured to receive the output voltage $V_{OUT2}$ from second comparator 238. The resistance value of the resistors of second voltage divider 232 and third voltage divider 234 can be chosen such that when the reference voltage $V_{ref\_a}$ is between the first threshold voltage $V_{th\_b}$ and the second threshold voltage $V_{th\_c}$, the latching relay remains open (i.e., alarm 118 is not activated). In response to the reference voltage $V_{ref\_a}$ changing to be greater than the first threshold voltage $V_{th\_b}$ or less than the second threshold voltage $V_{th\_c}$, the latching relay can be engaged or closed to activate alarm 118. For example, with momentary reference to FIG. 3A and FIG. 4A, resistance values for R4 and R5 can be chosen to select the first threshold voltage $V_{th\_b}$ and resistance values for R6 and R7 can be chosen to select the second threshold voltage $V_{th\_c}$, such that the first threshold voltage $V_{th\_b}$ is greater than the second threshold voltage $V_{th\_c}$. In this manner, first and second comparators 236 and 238 can keep the latching relay 240 closed unless the reference voltage $V_{ref\_a}$ from first voltage divider 230 is no longer between the threshold voltages $V_{th\_b}$ and $V_{th\_c}$ created by second voltage divider 232 and third voltage divider 234, respectively. Moreover, once the latching relay 240 is triggered in response to the reference voltage $V_{ref\_a}$ falling outside of the predetermined voltage threshold (e.g., in response to the reference voltage $V_{ref\_a}$ being greater than first threshold voltage $V_{th\_b}$ or less than second threshold voltage $V_{th\_c}$), the latching relay 240 can be configured to remain engaged (e.g., closed circuit) and not reset even if the circuit is corrected (i.e., even if the reference voltage $V_{ref\_a}$ changes to be between first threshold voltage $V_{th\_b}$ and second threshold voltage $V_{th\_c}$). Theft deterrence system 100 can include an interrupter switch 241 for resetting (e.g., opening) the latching relay 240. Interrupter switch 241 can be configured to be operated manually to reset latching relay 240. Interrupter switch 241 can be located in a secure location (e.g., inside of the vehicle). In this manner, a thief is prevented from disabling the theft deterrence system 100 after it has been activated. While, in various examples, latching relay 240 is implemented using analog components (e.g., a 4-pin relay, among others), latching relay 240 can also be implemented digitally, where the reference voltage $V_{ref\_a}$ can be converted to a digital signal and compared with voltage threshold values stored in memory of the control unit 114.

In a non-limiting example, reference voltage $V_{ref\_a}$ can be selected to be one half of the input voltage (i.e., $V_{in}/2$), for example when the resistance value of the second resistor R2 is equal to the sum of the resistance values of the first and third resistors R1 and R3. First threshold voltage $V_{th\_b}$ can be selected to be about 60% of the input voltage (i.e., $3V_{in}/5$), for example when the resistance value of resistor R4 is equal to two-thirds of the resistance value of resistor R5 (i.e., R4=(2/3)*R5). Second threshold voltage $V_{th\_c}$ can be selected to be about 40% of the input voltage (i.e., $2V_{in}/5$), for example when the resistance value of resistor R4 is equal to 150% of the resistance value of resistor R5 (i.e., R4=(3/2)*R5). However, it should be understood that various values can be chosen for reference voltage $V_{ref\_a}$, first threshold voltage $V_{th\_b}$, and second threshold voltage $V_{th\_c}$ to ensure proper engagement of latching relay 240 and to decrease the likelihood of false positives (i.e., false theft detection).

In various examples, first comparator 236 and/or second comparator 238 can output an output voltage $V_{OUT}$ equal to the input voltage $V_{in}$, in response to reference voltage $V_{ref\_a}$ falling outside of a predetermined voltage threshold (e.g., between first threshold voltage $V_{th\_b}$ and second threshold voltage $V_{th\_c}$), e.g., in response to a thief tampering with or cutting away catalytic converter 110. In response to the latching relay 240 receiving the output voltage $V_{OUT}$ equal to the input voltage Vi, (e.g., 12 volts), or another predetermined voltage, the latching relay 240 can output an alarm signal (e.g., a voltage signal or a current signal) to alarm 118 to generate an audible and/or visual deterrent.

Electrical conductor 116 can be mechanically and/or electrically coupled to catalytic converter 110. In this manner, resistor R3 and catalytic converter 110 can be coupled in series. Stated differently, resistor R3 can be grounded via catalytic converter 110. Stated differently, catalytic converter 110 can provide an electrically conductive current flow path for an electric current to flow from resistor R2, through resistor R3, through catalytic converter 110, and into a common ground 190. In response to a thief removing catalytic converter 110, the circuit can be opened, thereby preventing electric current from flowing through resistor R3. In response, the first voltage divider 230 may no longer output a reference voltage $V_{ref\_a}$ substantially equal to $(V_{in}*(R1+R3))/(R1+R2+R3)$, but instead output a reference voltage $V_{ref\_a}$ substantially equal to $(V_{in}*R1)/(R1+R2)$. In this manner, the reference voltage $V_{ref\_a}$ may fall below the second threshold voltage $V_{th\_c}$ and trigger the alarm 118. The reference voltage $V_{ref\_a}$ can also fall below the second threshold voltage $V_{th\_c}$ and trigger the alarm 118 in response to a thief tampering with the catalytic converter 110 such that the resistance value of R3 (or the associated sum of resistance of R3, the electrical conductor 116, and/or catalytic converter 110) decreases. Conversely, should a thief tamper with the bypass theft deterrence system 100 such that the resistance value of R3 (or the associated sum of resistance of R3, the electrical conductor 116, and/or catalytic converter 110) increases, the reference voltage $V_{ref\_a}$ may increase above first threshold voltage $V_{th\_b}$, thereby triggering the alarm 118. In this regard, by providing two comparators 236 and 238, control unit 114 tends to provide a robust, tamper-resistant system that inhibits thieves from tampering with the theft deterrence system 100.

In various examples, control unit 114 can comprise a housing 115—schematically illustrated by the dashed line in FIG. 2—in which the electronic components of control unit 114 can be housed. In various examples, resistor R3 is housed within housing 115. In various examples, resistor R3 is located outside of housing 115 and at or on or coupled to the catalytic converter 110. In this manner, shorting or cutting out the resistor R3 in order to remove the catalytic converter 110 will change the output of voltage divider 230.

Figure 5:
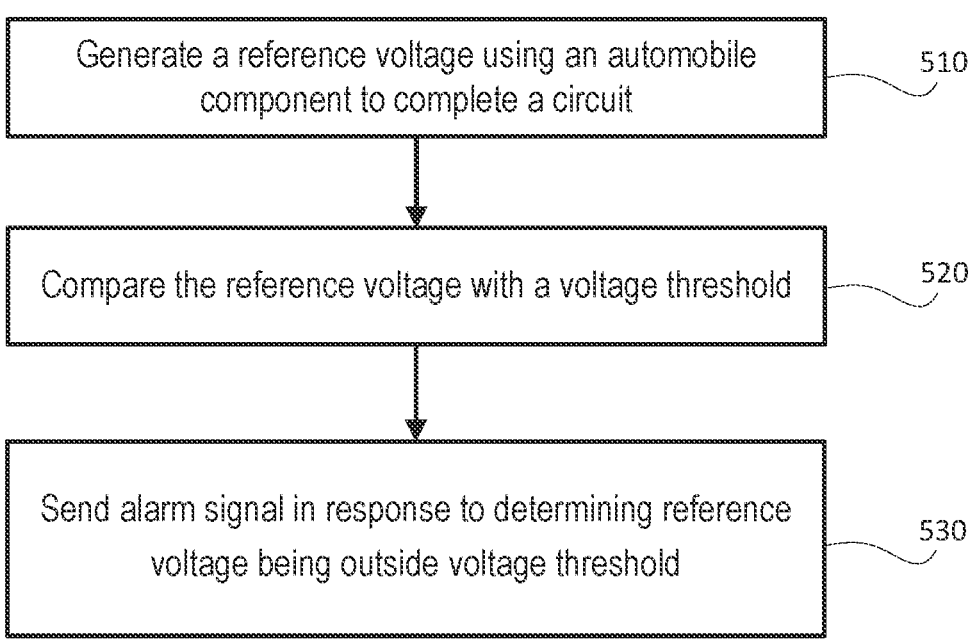
FIG. 5 illustrates a flow chart for a method for theft deterrence monitoring of a vehicle component, in accordance with various examples.

FIG. 5 illustrates a flow chart for a method 500 for theft deterrence monitoring of a vehicle component, in accordance with various examples. For ease of description, the method 500 is described below with reference to FIG. 2. The method 500 of the present disclosure, however, is not limited to use of the exemplary theft deterrence system 100 of FIG. 2.

In step 510, control unit 114 generates reference voltage $V_{ref\_a}$ using catalytic converter 110 to complete the circuit, for example by using catalytic converter 110 to connect to a common ground 190. For example, voltage divider 230 receives the input voltage $V_{in}$ and steps down the input voltage $V_{in}$ to reference voltage $V_{ref\_a}$ based upon resistors R1, R2, and R3. Resistor R1 is connected to common ground 190 separate from resistor R3. In this manner, voltage divider 230 continues to generate reference voltage $V_{ref\_a}$ even when an open circuit condition exists through resistor R3.

In step 520, control unit 114 can compare the reference voltage $V_{ref\_a}$ with a voltage threshold envelope, which can be a range of voltages between first threshold voltage $V_{th\_b}$ and second threshold voltage $V_{th\_c}$. In step 520, control unit 114 can compare the reference voltage $V_{ref\_a}$ with a voltage threshold, which can be threshold voltage $V_{th\_b}$ (see FIG. 6). Step 520 can be performed using analog components or can be performed digitally.

In step 530, in response to control unit 114 detecting that the reference voltage $V_{ref\_a}$ is outside of the predetermined voltage threshold, control unit 114 can send an alarm signal to the alarm 118 to provide an audible and/or visual deterrent and/or alert others nearby that the vehicle component is being tampered with and/or removed from the vehicle. In response to sending an alarm signal, an alarm can be activated, such as the horn on a car, a speaker, a light, and/or another audio or visual alert.

Figures 6, 7:
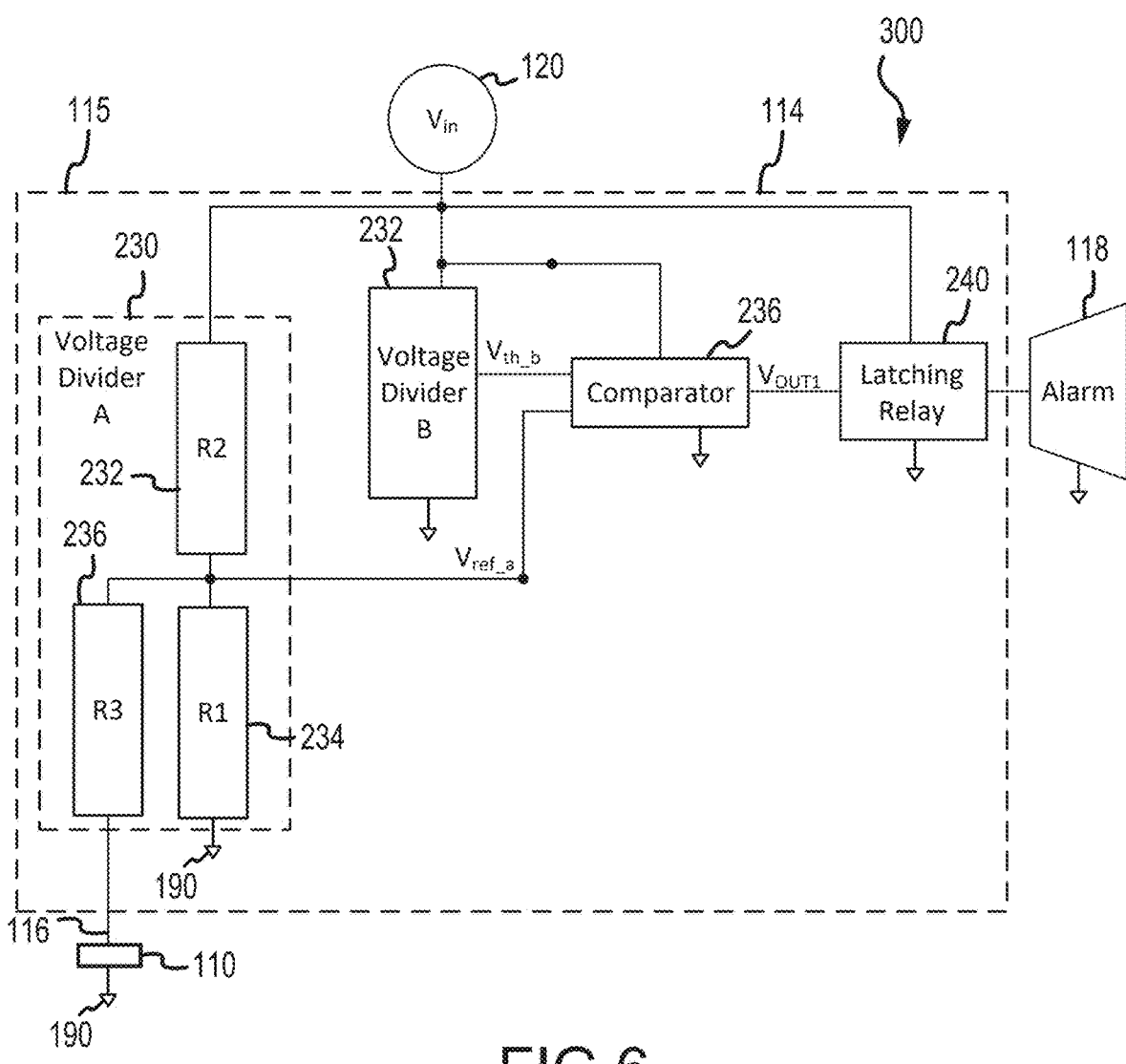
FIG. 6 illustrates a block diagram of the theft deterrence system, in accordance with various examples.
FIG. 7 illustrates a block diagram of a communication network in operable communication with a theft deterrence system and a remote electronic component, in accordance with various examples.

Having described the exemplary theft deterrence system 100 of FIG. 2 which monitors the reference voltage $V_{ref\_a}$ and activates alarm 118 in response to the reference voltage $V_{ref\_a}$ falling outside of a threshold envelope (i.e., in response to the reference voltage $V_{ref\_a}$ changing to be greater than the first threshold voltage $V_{th\_b}$ or less than the second threshold voltage $V_{th\_c}$, it is further contemplated that a theft deterrence system of the present disclosure can further activate the alarm 118 in response to the reference voltage $V_{ref\_a}$ increasing above (or decreasing below) a single threshold voltage. For example, FIG. 6 illustrates a block diagram of theft deterrence system 300 which includes only one comparator 236, in accordance with various examples. With respect to FIG. 6, elements with like element numbering, as depicted in FIG. 2, are intended to be the same and will not necessarily be repeated for the sake of clarity. In various examples, comparator 236 is a non-inverting comparator (e.g., see FIG. 3A), wherein the theft deterrence system 100 activates alarm 118 in response to reference voltage $V_{ref\_a}$ increasing above threshold voltage $V_{th\_b}$ (or decreasing below threshold voltage $V_{th\_b}$). In various examples, comparator 236 is an inverting comparator (e.g., see FIG. 4A), wherein the theft deterrence system 100 activates alarm 118 in response to reference voltage $V_{ref\_a}$ decreasing below threshold voltage $V_{th\_b}$ (or increasing above threshold voltage $V_{th\_b}$).

Having described various examples of the present disclosure with reference to FIG. 2 through FIG. 4 and FIG. 6, it is contemplated herein that other electronic components can be used to create a comparison logic besides resistive voltage dividers and an op-amp comparators. For example, low-pass RC filters, inductive dividers, capacitive dividers, or other dividers can be implemented for creating the comparison logic without departing from the scope of the present disclosure. Moreover, mechanical, optical, and digital, pneumatic, and other comparators can be implemented for creating the comparison logic without departing from the scope of the present disclosure. Moreover, other circuits which create voltage (such as diodes or regulators), instead of voltage dividers, can be implemented for creating the comparison logic without departing from the scope of the present disclosure. Moreover, other circuits which cause the alarm 118 to stay on other than latching relays can be used without departing from the scope of the present disclosure. Moreover, various control logic described herein with respect to control unit 114 can be performed digitally.

Benefits and other advantages have been described herein with regard to specific examples. Furthermore, the connecting lines shown in the various figures contained herein are intended to represent example functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various examples", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other examples whether or not explicitly described. After reading the description, it will be apparent to one skilled in the relevant art(s) how to implement the disclosure in alternative examples.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A theft deterrence system, comprising:
a control unit comprising a first voltage divider, the first voltage divider comprises a first resistor, a second resistor, and a third resistor, the first resistor is coupled in parallel with the third resistor; and
an electrical conductor whereby the first voltage divider is configured to be electrically coupled to a vehicle component, the third resistor is configured to be coupled in series with the vehicle component via the electrical conductor,
wherein the first voltage divider is configured to generate a reference voltage,
the reference voltage is equal to a voltage measured between the second resistor and the first resistor,
the control unit is configured to compare the reference voltage with a voltage threshold, and
the control unit is configured to send an alarm signal to an alarm in response to the reference voltage being outside the voltage threshold.

2. The theft deterrence system of claim 1, wherein the control unit is configured to receive electric power from a vehicle battery.

3. The theft deterrence system of claim 1, wherein the vehicle component is a catalytic converter.

4. The theft deterrence system of claim 1, wherein:
the control unit further comprises a first comparator and a second comparator;

the first comparator is a non-inverting comparator;
the second comparator is an inverting comparator; and
the control unit is configured to compare the reference voltage with the voltage threshold using the first comparator and the second comparator.

5. The theft deterrence system of claim 4, wherein:
the control unit further comprises a second voltage divider and a third voltage divider;
the first comparator is configured to receive a first threshold voltage from the second voltage divider;
the second comparator is configured to receive a second threshold voltage from the third voltage divider; and
the voltage threshold is between the first threshold voltage and the second threshold voltage.

6. The theft deterrence system of claim 1, further comprising a latching relay configured to activate the alarm.

7. The theft deterrence system of claim 6, wherein the latching relay is configured to receive a first output voltage from a first comparator and a second output voltage from a second comparator.

8. The theft deterrence system of claim 2, wherein the first voltage divider is configured to divide an input voltage received from the vehicle battery.

9. The theft deterrence system of claim 1, wherein the alarm comprises at least one of a speaker or a light.

10. The theft deterrence system of claim 1, wherein the alarm comprises a remote electronic component.

11. A method for theft deterrence monitoring of a vehicle component, comprising:
generating a reference voltage using the vehicle component to complete a circuit, the reference voltage is generated by a voltage divider of a control unit, the control unit is electrically coupled to the vehicle component via an electrical conductor, the voltage divider comprises a first resistor, a second resistor, and a third resistor, wherein the third resistor is coupled in series with the vehicle component via the electrical conductor;
comparing the reference voltage with a voltage threshold, the reference voltage is equal to a voltage measured between the second resistor and the first resistor; and
sending an alarm signal to an alarm in response to the reference voltage being outside the voltage threshold.

12. The method of claim 11, wherein the control unit is configured to receive power from a vehicle battery.

13. The method of claim 11, wherein the vehicle component is a catalytic converter.

14. The method of claim 11, wherein the alarm comprises at least one of a speaker, a light, or a remote electronic component.

15. A method for theft deterrence monitoring of a vehicle component, the method comprising:
receiving, by a control unit, an input voltage from a power source comprised in a vehicle, the control unit is electrically coupled to the vehicle component via an electrical conductor, the control unit comprises a voltage divider, the voltage divider comprises a first resistor, a second resistor, and a third resistor, wherein the third resistor is coupled in series with the vehicle component via the electrical conductor;
generating, by the control unit, a reference voltage using the vehicle component to complete a circuit, the reference voltage is equal to a voltage measured between the second resistor and the first resistor;
comparing, by the control unit, the reference voltage with a voltage threshold;

detecting, by the control unit, that the reference voltage is outside of the voltage threshold; and sending, by the control unit, an alarm signal to an alarm in response to the control unit detecting that the reference voltage is outside of the voltage threshold.

16. A theft deterrence system, comprising:

a control unit comprising a first voltage divider;

a first, non-inverting comparator;

a second, inverting comparator; and an electrical conductor whereby the first voltage divider is configured to be electrically coupled to a vehicle component, wherein the first voltage divider is configured to generate a reference voltage, the control unit is configured to compare the reference voltage with a voltage threshold using the first comparator and the second comparator, and the control unit is configured to send an alarm signal to an alarm in response to the reference voltage being outside the voltage threshold.

* * * * *